(12) United States Patent
Zhou

(10) Patent No.: US 10,826,001 B2
(45) Date of Patent: Nov. 3, 2020

(54) OLED ARRAY SUBSTRATE AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventor: Weilong Zhou, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 22 days.

(21) Appl. No.: 15/994,488

(22) Filed: May 31, 2018

(65) Prior Publication Data

US 2019/0036047 A1    Jan. 31, 2019

(30) Foreign Application Priority Data

Jul. 27, 2017 (CN) .......................... 2017 1 0624627

(51) Int. Cl.
*H01L 51/00* (2006.01)
*H01L 27/32* (2006.01)
(Continued)

(52) U.S. Cl.
CPC ....... *H01L 51/0096* (2013.01); *G09G 3/3225* (2013.01); *H01L 27/3227* (2013.01); *H01L 27/3258* (2013.01); *H01L 27/3262* (2013.01); *H01L 51/5056* (2013.01); *H01L 51/5072* (2013.01); *H01L 51/5092* (2013.01); *H01L 51/4253* (2013.01); *H01L 51/441* (2013.01);
(Continued)

(58) Field of Classification Search
None
See application file for complete search history.

(56) References Cited

U.S. PATENT DOCUMENTS 9,865,661 B2 *  1/2018  Sato ................... H01L 27/3227
10,345,670 B2 *  7/2019  Ikeda ................ G02F 1/133526
(Continued)

FOREIGN PATENT DOCUMENTS

CN          103928474 A        7/2014
CN          106409878 A  *     2/2017
(Continued)

OTHER PUBLICATIONS

The Second Chinese Office Action dated Dec. 27, 2019 Application No. 201710624627.8 (Year: 2019).*

(Continued)

*Primary Examiner* — Telly D Green

(57) ABSTRACT

An Organic Light-Emitting Diode (OLED) array substrate and a display apparatus. The OLED array substrate includes a base substrate, a pixel driving circuit and an OLED display element layer which are arranged on the base substrate. The OLED array substrate further includes a solar cell, the solar cell is arranged on a side of the pixel driving circuit which faces an incident ambient light, the solar cell and the pixel driving circuit are insulated from each other, and the solar cell and the OLED display element layer are insulated from each other.

14 Claims, 6 Drawing Sheets

(51) Int. Cl.
*H01L 51/50* (2006.01)
*G09G 3/3225* (2016.01)
*H01L 51/52* (2006.01)
*H01L 51/44* (2006.01)
*H01L 51/42* (2006.01)

(52) U.S. Cl.
CPC ...... *H01L 51/5218* (2013.01); *H01L 51/5234* (2013.01); *H01L 2251/5315* (2013.01)

(56) References Cited

U.S. PATENT DOCUMENTS

| | | |
|---|---|---|
| 2004/0170927 A1 | 9/2004 | Pichler |
| 2015/0318501 A1 | 11/2015 | Watanabe et al. |
| 2015/0380476 A1 | 12/2015 | Zhang et al. |
| 2016/0155782 A1* | 6/2016 | Sato .................... H01L 27/3227 257/82 |
| 2018/0039117 A1* | 2/2018 | Ikeda ................. H01L 27/3251 |
| 2019/0391427 A1* | 12/2019 | Ikeda ................. H01L 27/3262 |

FOREIGN PATENT DOCUMENTS

| | | |
|---|---|---|
| CN | 106409878 A | 2/2017 |
| CN | 104904032 B | 8/2017 |
| KR | 20180024097 A * | 3/2018 |

OTHER PUBLICATIONS

The First Chinese Office Action dated Jun. 3, 2019; Appln, No. 201710624627.8.

* cited by examiner

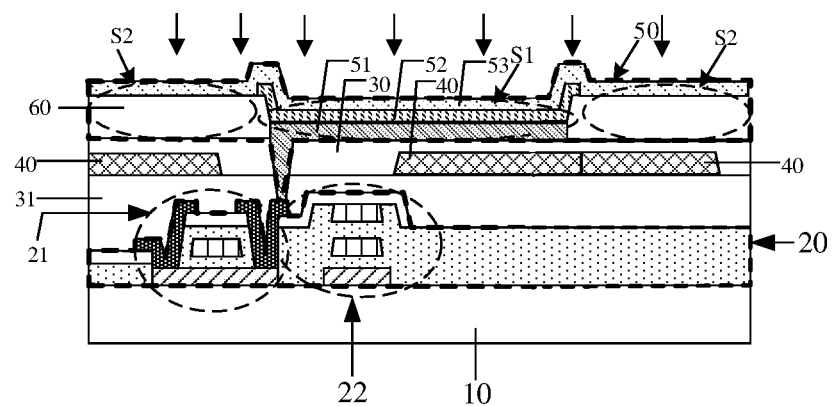
FIG. 1 ( a )
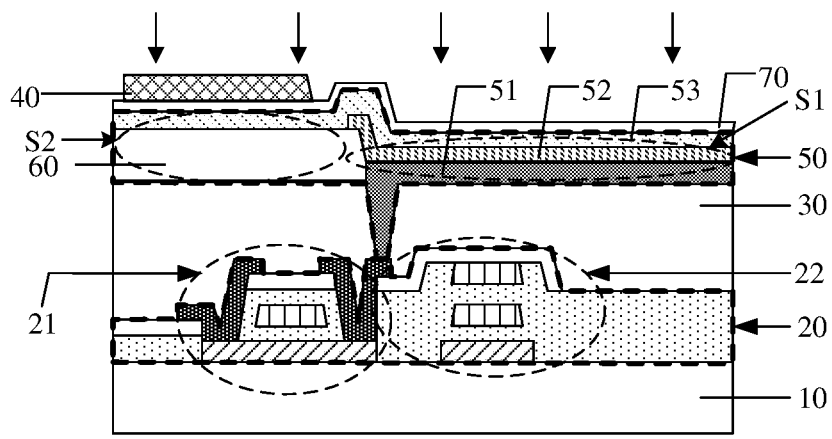
FIG. 1 ( b )

OLED ARRAY SUBSTRATE AND DISPLAY APPARATUS

The present application claims priority of the Chinese Patent Application No. 201710624627.8 filed on Jul. 27, 2017, the disclosure of which is incorporated herein by its reference in its entirety as part of the present application.

TECHNICAL FIELD

Embodiments of the present disclosure relate to an Organic Light-Emitting Diode (OLED) array substrate and a display apparatus.

BACKGROUND

An OLED display technology has been successfully commercialized after decades of development, shows huge potential in the high-tech display fields of flexibility, transparence and the like, and meanwhile, is also well developed in the field of illumination.

An OLED display, at the same time of meeting users' demands, should also consider the problem of power endurance, which is very meaningful for both manufacturers and users.

By taking a mobile phone as an example, methods for improving power endurance of the mobile phone are all basically focused on increasing cell capacity and reducing power consumption of electrical devices in the mobile phone. Increasing cell capacity means using a high-capacity cell but the high-capacity cell has a certain potential safety hazard. In addition, as the mobile phone manufacturing technology gradually matures and in order to meet various demands of users, it becomes more and more difficult to reduce the power consumption of the electrical devices of the mobile phone.

SUMMARY

According to embodiments of the disclosure, an Organic Light-Emitting Diode (OLED) array substrate is provided. The OLED array substrate comprises a base substrate, a pixel driving circuit and an OLED display element layer which are arranged on the base substrate. The OLED array substrate further comprises a solar cell, the solar cell is arranged on a side of the pixel driving circuit which faces an incident ambient light, the solar cell and the pixel driving circuit are insulated from each other, and the solar cell and the OLED display element layer are insulated from each other.

For example, the OLED display element layer is arranged on a side of the pixel driving circuit which faces away from the base substrate; and the OLED display element layer is divided into a light-emitting region and a non-light-emitting region, the non-light-emitting region is transparent, and the solar cell is at least arranged between a portion of the OLED display element layer in the non-light-emitting region and the pixel driving circuit.

For example, an insulation layer is arranged between the solar cell and the pixel driving circuit and another insulation layer is arranged between the solar cell and the OLED display element layer.

For example, the OLED display element layer is arranged on a side of the pixel driving circuit which faces away from the base substrate; and the OLED display element layer is divided into a light-emitting region and a non-light-emitting region, and the solar cell is at least arranged on a side of a portion of the OLED display element layer in the non-light-emitting region which faces the incident ambient light.

For example, an insulation layer is arranged between the solar cell and the OLED display element layer.

For example, the solar cell includes a cathode, a first transport layer, an active layer, a second transport layer and an anode which are sequentially arranged; and in the solar cell, a portion arranged on a side of the active layer which faces away from the base substrate is transparent.

For example, the solar cell is a perovskite solar cell or an organic solar cell.

For example, the solar cell includes a plurality of sub solar cells connected with each other in series, and the plurality of sub solar cells connected with each other in series supply power to the OLED array substrate.

For example, the OLED display element layer includes a plurality of OLED display elements, and each of the plurality of OLED display elements includes an anode, a light-emitting functional layer and a cathode which are sequentially arranged along a direction facing away from the base substrate.

For example, the light-emitting functional layer includes: a hole injection layer, a hole transport layer, an electron barrier layer, an light-emitting layer, a hole barrier layer, an electron transport layer and an electron injection layer which are sequentially arranged along a direction facing away from the anode.

For example, each of the plurality of OLED display elements is of a top light-emitting type, and both the cathode and the anode of each of the plurality of OLED display elements include a metal.

For example, the OLED display element layer includes a plurality of OLED display elements, and each of the plurality of OLED display elements includes an anode, a light-emitting functional layer and a cathode which are sequentially arranged along a direction facing away from the base substrate; both the anode and the cathode of the OLED display element are transparent; the solar cell is further arranged between a portion of the OLED display element layer in the light-emitting region and the pixel driving circuit; and a portion of the solar cell between the portion of the OLED display element layer in the light-emitting region and the pixel driving circuit is electrically connected with a portion of the solar cell between the portion of the OLED display element layer in the non-light-emitting region and the pixel driving circuit.

For example, two cell pins are provided in a bonding region of the OLED array substrate, and the two cell pins are respectively connected with the cathode and the anode of the solar cell.

According to the embodiments of the disclosure, a display apparatus comprising the OLED array substrate as described above is provided.

For example, the display apparatus further comprises a power supply circuit, the power supply circuit includes a direct current (DC) converter, and the solar cell is electrically connected with an input end of the DC converter.

For example, the OLED display element layer includes a plurality of OLED display elements; and the plurality of OLED display elements and the pixel driving circuit are electrically connected with an output end of the DC converter.

For example, the display apparatus further comprises a package layer arranged oppositely to the OLED array substrate, the OLED display element layer includes a plurality of OLED display elements, each of the plurality of OLED display elements is a top light-emitting device, and the OLED display apparatus further comprises a polarizer arranged on a side of the package layer which faces away from the OLED array substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
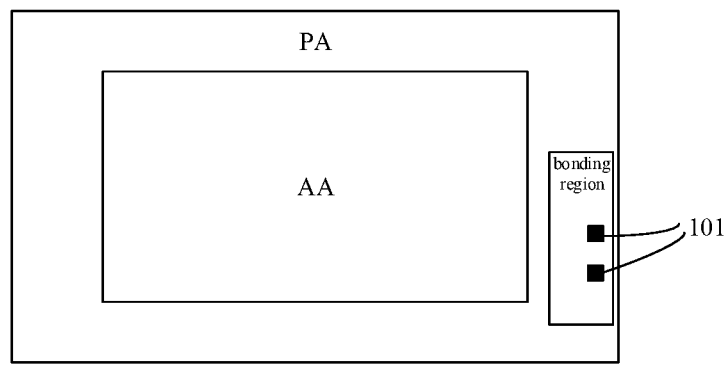
FIG. 1(a) is a sectional schematic diagram I of an OLED array substrate provided by embodiments of the present disclosure.
FIG. 1(b) is a sectional schematic diagram II of the OLED array substrate provided by the embodiments of the present disclosure.
FIG. 1(c) is a planar schematic diagram of the OLED array substrate provided by the embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

According to embodiments of the present disclosure, an OLED array substrate is provided. The OLED array substrate includes a base substrate, a pixel driving circuit and an OLED display element layer arranged on the base substrate. The OLED array substrate further includes a solar cell, the solar cell is arranged on a side of the pixel driving circuit which faces an incident ambient light, the solar cell and the pixel driving circuit are insulated from each other, and the solar cell and the OLED display element layer are insulated from each other.

According to the embodiments of the present disclosure, the incident ambient light irradiates the solar cell, and then the solar cell converts light energy into electric energy and supplies the electric energy to the OLED array substrate for compensating electric energy required by an OLED display element for emitting light, so as to benefit energy saving and implement green and environmental protection. The market is enriched and more choices are provided for users.

The incident ambient light, for example, is sunlight, and in FIG. 1(a) and FIG. 1(b), the incident ambient light is shown with vertical arrows.

For example, a region in the pixel driving circuit, where structures such as a thin film transistor and the like are arranged, is not transparent, and thus, by arranging the solar cell on the side of the pixel driving circuit which faces the incident ambient light, it can avoid reduction of the sunlight irradiating the solar cell due to shielding of the structures such as the thin film transistor and the like, or it can avoid arrangement of other light guide structures in the OLED array substrate in order to enable the sunlight originally irradiating the structures such as the thin film transistor and the like to irradiate the solar cell. Therefore, in the embodiments of the present disclosure, by arranging the solar cell on the side of the pixel driving circuit which faces to the incident ambient light, the OLED array substrate has the advantages of high sunlight utilization rate and simple structure.

The OLED array substrate according to the embodiments of the present disclosure will be further described in detail in connection with the drawings.

For example, as shown in FIG. 1(a), the OLED array substrate according to the embodiments of the present disclosure includes a base substrate 10, a pixel driving circuit 20 arranged on the base substrate 10 and an OLED display element layer 50 arranged on a side of the pixel driving circuit 20 which faces away from the base substrate 10; the OLED array substrate according to the embodiments of the present disclosure further includes a solar cell 40; the OLED display element layer 50 is divided into a light-emitting region S1 and a non-light-emitting region S2, the non-light-emitting region S2 is transparent, and the solar cell 40 is at least arranged between a portion of the OLED display element layer 50 in the non-light-emitting region S2 and the pixel driving circuit 20; and the solar cell 40 and the pixel driving circuit 20 are insulated from each other, and the solar cell 40 and the OLED display element layer 50 are insulated from each other.

For example, the pixel driving circuit 20 includes a switching transistor, a driving transistor 21, a storage capacitor 22 which is connected with the driving transistor 21, power lines (including $V_{DD}$ and $V_{SS}$), signal lines (including $V_{gh}$, $V_{gl}$ and the like), a gate line, a data line and the like (in FIG. 1, for convenience, only the driving transistor 21 and the storage capacitor 22 are shown).

For example, the OLED array substrate further include a pixel definition layer 60 arranged in the transparent non-light-emitting region S2, a supporting layer (not shown in the drawing) for preventing damage to the pixel definition layer 60 and the like.

For example, the OLED display element layer 50 includes a plurality of OLED display elements, the light-emitting region S1 means a region occupied by one of the OLED display elements, and the non-light-emitting region S2 means a region outside the OLED display elements. For example, each OLED display element includes an anode 51 electrically connected with a drain electrode of the driving transistor 21, a light-emitting functional layer 52 and a cathode, and the light-emitting region S1 further means a region occupied by the light-emitting functional layer of one of the OLED display elements.

For example, the anode 51, the light-emitting functional layer 52 and the cathode 53 are sequentially arranged along a direction facing away from the base substrate 10, or are sequentially arranged along a direction close to the base substrate 10.

For example, the OLED display element is of a top light-emitting element, or is of a bottom light-emitting element, or is of a double-sided light-emitting element in which both the cathode 53 and the anode 51 are transparent. For example, in the case that the OLED display element is of the bottom light-emitting element, the solar cell 40 is transparent so as to ensure that light from the OLED display element emerges to an external environment.

Exemplarily, by taking a structure that the anode 51 is closer to the base substrate 10 than the cathode 53 as an example, in the case that the anode 51 is of a total reflection structure and the cathode 53 is of a semi-reflection structure (i.e., part of the cathode 53 is of a reflection structure, and part of the cathode 53 is of a transmission structure), the OLED display element is of the top light-emitting element; and in the case that the anode 51 is of a total transmission structure and the cathode 53 is also of a total transmission structure, the OLED display element is of the double-sided light-emitting element.

Figure 8:
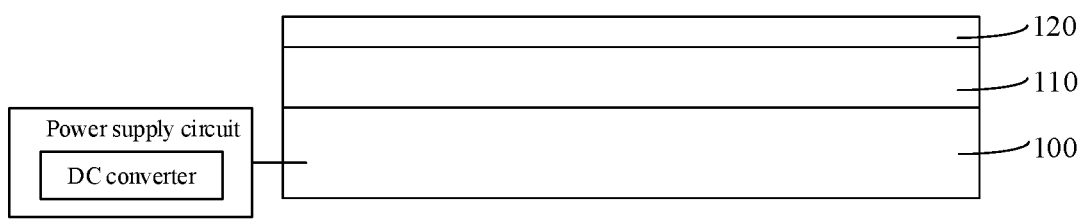
FIG. 8 is a sectional schematic diagram of a display apparatus provided by embodiments of the present disclosure.

Herein, in the case that the OLED display element is of the top light-emitting element and the OLED array substrate is applied to an OLED display apparatus, the sunlight irradiates the OLED display element and is reflected by the anode 51 to emerge from the OLED display apparatus, light intensity of the sunlight is very high, which influences contrast of the OLED display apparatus a lot, particularly the sunlight in high noon is reflected to emerge from the OLED display apparatus and a user nearly cannot see an image displayed by the OLED display apparatus, and thus, the OLED display apparatus for example further include a polarizer 120 arranged on a side of a package layer 110 (for example, a package cover plate) which faces away from the OLED array substrate as shown in FIG. 8, so that the sunlight does not emerge from the OLED display apparatus after irradiating the OLED display apparatus, which can avoid influence of the sunlight on the contrast of the OLED display apparatus.

For example, by taking a structure that the anode 51 is closer to the base substrate 10 than the cathode 53 as an example, the cathode 53 is an anti-reflection electrode so as to reduce or avoid the reflection of the sunlight.

From the above, the OLED display element layer 50 further includes the transparent non-light-emitting region S2, and the non-light-emitting region S2, for example, means a region in the OLED display element layer 50 except for the light-emitting region S1. For example, the sunlight passes through the transparent non-light-emitting region S2 to irradiate the solar cell 40.

For example, the solar cell 40 and the pixel driving circuit 20 are insulated from each other and the solar cell 40 and the OLED display element layer 50 are insulated from each other mean that: the solar cell 40 is not in direct contact with the pixel driving circuit 20, and the solar cell 40 is not in direct contact with the OLED display element layer 50. For example, insulation layers are respectively arranged between the solar cell 40 and the pixel driving circuit 20 and between the solar cell 40 and the OLED display element layer 50 so as to avoid an electrical connection of the solar cell 40 and the OLED display element layer 50 and an electrical connection of the solar cell 40 and the pixel driving circuit 20. Meanwhile, a parasitic capacitance between the solar cell 40 and the OLED display element is avoided by regulating a thickness of the insulation layer between the solar cell 40 and the OLED display element, and exemplarily, the thickness of the insulation layer between the solar cell 40 and the OLED display element layer 50 is 3 to 6 μm.

In the embodiments of the present disclosure, a type and a structure of the solar cell 40 are not limited, as long as a total voltage output by the solar cell 40 supplies power to the OLED array substrate. For example, the solar cell 40 is a perovskite solar cell, an organic solar cell and the like.

Figure 2A:
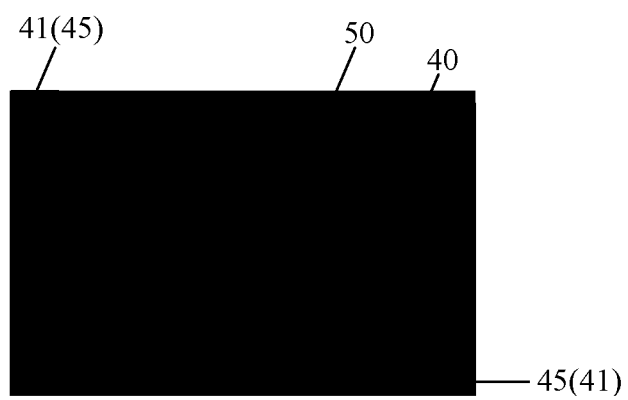
FIG. 2(a) is a top-view schematic diagram I of a solar cell provided by the embodiments of the present disclosure.
Figure 2B:
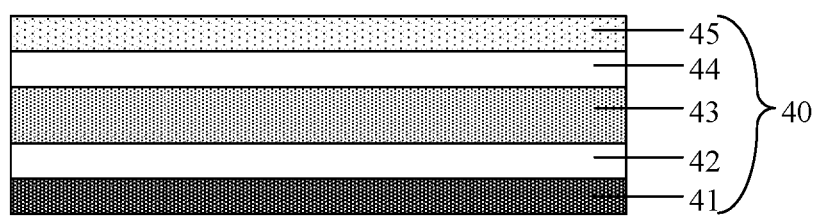
FIG. 2(b) is a sectional schematic diagram I along an A-A' direction in FIG. 2(a)
Figure 2C:
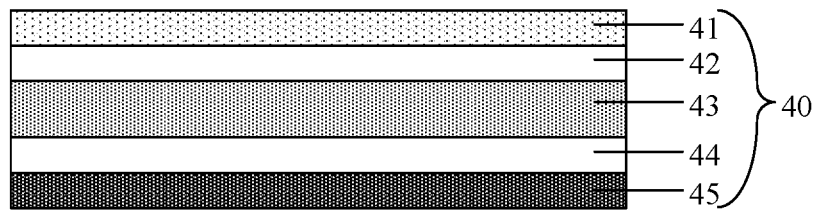
FIG. 2(c) is a sectional schematic diagram II along the A-A' direction in FIG. 2(a)
Figure 3A:
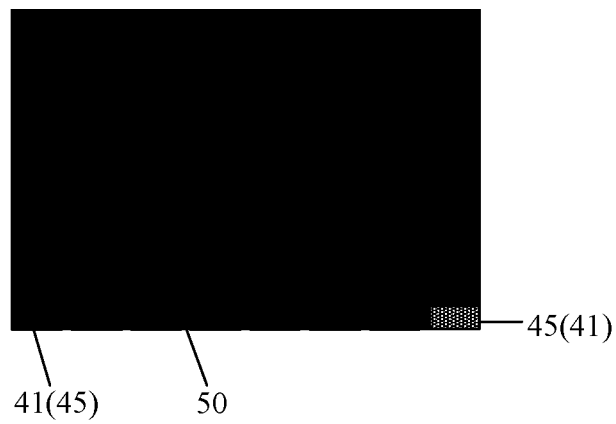
FIG. 3(a) is a top-view schematic diagram II of the solar cell provided by the embodiments of the present disclosure.
Figure 3B:
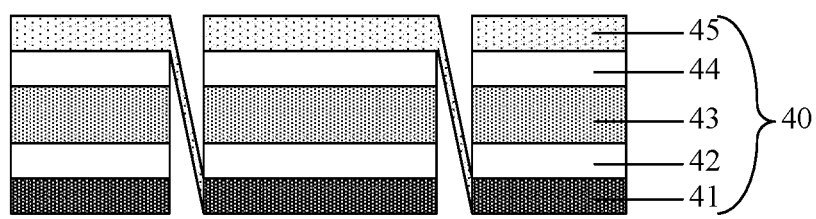
FIG. 3(b) is a sectional schematic diagram I along a B-B' direction in FIG. 3(a)
Figure 3C:
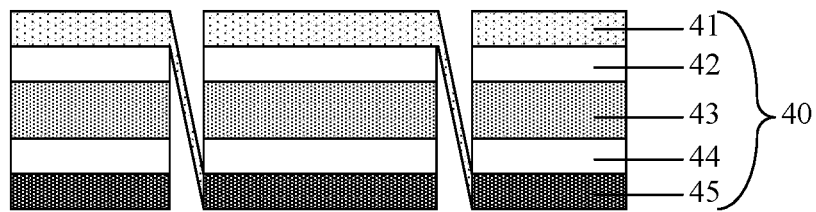
FIG. 3(c) is a sectional schematic diagram II along the B-B' direction in FIG. 3(a)

The solar cell 40 for example is arranged in different modes as follows. For example, as shown in FIGS. 2(a) to 2(c), the solar cell 40 only includes one solar cell. The one solar cell is continuously stacked between the entire OLED display element layer 50 and the entire pixel driving circuit 20 (in FIG. 2(a), protruding portions in the solar cell respectively are the anode and the cathode of the solar cell). For example, as shown in FIGS. 3(a) to 3(c), the solar cell 40 include a plurality of sub solar cells, the plurality of sub solar cells are arranged between the entire OLED display element layer 50 and the entire pixel driving circuit 20, the sub solar cells are electrically connected with each other (in FIG. 3(a), the adjacent sub solar cells are electrically connected with each other in series, and portions which are not electrically connected and protrude respectively are the anode and the cathode of the solar cell). For example, the solar cell 40 is only arranged in a region corresponding to the non-light-emitting region. For example, the solar cell 40 includes the plurality of sub solar cells, each sub solar cell is only arranged in the region corresponding to the non-light-emitting region, and the sub solar cells are electrically connected with each other in series. It should be noted that the arrangement mode of the solar cell 40 is not limited to the above modes.

A working principle of the solar cell 40 is that light energy is converted into electric energy so as to supply power to the OLED array substrate.

The embodiments of the present disclosure provides the OLED array substrate. By at least arranging the solar cell 40 between the portion of the OLED display element layer 50 in the non-light-emitting region and the pixel driving circuit 20, in the case that the OLED array substrate is applied to the OLED display apparatus, the sunlight passes through the transparent non-light-emitting region of the OLED display element layer 50 to irradiate the solar cell 40, and the solar cell 40 converts the light energy into the electric energy and supplies the electric energy to the OLED array substrate for compensating electric energy required by the OLED display element for emitting light so as to benefit saving energy and implement green and environment protection. The market is enriched, and more choices are provided for users.

On this basis, in the pixel driving circuit 20, the region where the structures such as the thin film transistor and the like are arranged is not transparent, and thus, the solar cell 40 at least is arranged between the portion of the OLED display element layer 50 in the non-light-emitting region and the pixel driving circuit 20 rather than is arranged between the pixel driving circuit 20 and the base substrate 10, which avoids reduction of the sunlight irradiating the solar cell 40 due to shielding of the structures such as the thin film transistor and the like, or avoids arrangement of other light guide structures in the OLED array apparatus in order to enable the sunlight originally irradiating the structures such as the thin film transistor and the like to irradiate the solar cell 40. From the above, the embodiments of the present disclosure have the advantages of high sunlight utilization rate and simple structure.

For example, a planarization layer 31 formed by an insulation material is arranged between the solar cell 40 and the pixel driving circuit 20, and a planarization layer 30 formed by an insulation material is arranged between the solar cell 40 and the OLED display element layer 50.

It should be noted that materials of the planarization layers 30 and 31 are not limited, as long as the planarization layers are formed by the insulation materials, and for example, the materials of the planarization layers 30 and 31 include silicon nitride ($SiN_x$), silicon oxynitride ($SiO_xN_y$) and the like.

According to the embodiments of the present disclosure, by arranging the planarization layers formed by the insulation materials between the solar cell 40 and the pixel driving circuit 20 and between the solar cell 40 and the OLED display element layer 50, the OLED array substrate not only avoids the electrical connection of the solar cell 40 and the OLED display element and the electrical connection of the solar cell 40 and the pixel driving circuit 20, but also is beneficial for making each layer of structure in the OLED array substrate more stable.

For example, as shown in FIG. 1(b), the OLED array substrate according to the embodiments of the present disclosure includes the base substrate 10, the pixel driving circuit 20 arranged on the base substrate 10, and the OLED display element layer 50 arranged on the side of the pixel driving circuit which faces away from the base substrate 10; the OLED array substrate according to the embodiments of the present disclosure further includes the solar cell 40; the OLED display element layer 50 is divided into the light-emitting region and the non-light-emitting region, and the solar cell 40 is at least arranged on a side of a portion of the OLED display element layer 50 in the non-light-emitting region which faces the incident ambient light; and the solar cell 40 and the pixel driving circuit 20 are insulated from each other, and the solar cell 40 and the OLED display element layer 50 are insulated from each other. For example, as shown in FIG. 1(b), an insulation layer 70 is arranged between the solar cell 40 and the OLED display element layer 50 so that the solar cell 40 and the OLED display element layer 50 are insulated from each other; and a plurality of insulation layers, e.g., the insulation layer 70, the pixel definition layer 60 and the planarization layer 30, are arranged between the solar cell 40 and the pixel driving circuit 20 so that the solar cell 40 and the pixel driving circuit 20 are insulated from each other. For example, in FIG. 1(b), the non-light-emitting region of the OLED display element layer 50 for example is not transparent. It should be noted that other structures in FIG. 1(b) are the same as those in FIG. 1(a), and are not repeated herein.

For example, as shown in FIGS. 2(b), 2(c), 3(b) and 3(c), the solar cell 40 includes a cathode 41, a first transport layer 42, an active layer 43, a second transport layer 44 and an anode 45 which are sequentially arranged; and in the solar cell 40, a portion arranged on a side of the active layer 43 which faces away from the base substrate 10 is transparent.

For example, the cathode 41, the first transport layer 42, the active layer 43, the second transport layer 44 and the anode 45 are sequentially arranged along a direction facing away from the base substrate as shown in FIGS. 2(b) and 3(b), or are sequentially arranged along a direction close to the base substrate 10 as shown in FIGS. 2(c) and 3(c), which is not limited herein; however, it should be noted that no matter in which mode the cathode 41, the first transport layer 42, the active layer 43, the second transport layer 44 and the anode 45 are arranged, it at least should be ensured that in the solar cell 40, the portion arranged on the side of the active layer 43, which faces away from the base substrate 10, is transparent so as to enable the sunlight to irradiate the active layer 43.

Exemplarily, the cathode 41, the first transport layer 42, the active layer 43, the second transport layer 44 and the anode 45 are sequentially arranged along the direction facing away from the base substrate 10, it at least should be ensured that the anode 45 and the second transport layer 44 are transparent; and the cathode 41, the first transport layer 42, the active layer 43, the second transport layer 44 and the anode 45 are sequentially arranged along the direction close to the base substrate 10, it at least should be ensured that the cathode 41 and the first transport layer 42 are transparent.

For example, a material of the transparent anode 45 is a transparent conductive material such as Indium Tin Oxide (ITO) and the like; and a material of the transparent cathode 41 is a mixture of $SrVO_3$ and $CaVO_3$, or a metal which has a very small thickness so as to transmit light, e.g., Al.

In consideration that a case of adopting the metal as the material of the cathode 41 is relatively matured and transmittance of the metal is smaller than that of the transparent conductive material such as ITO and the like, preferably, as shown in FIGS. 2(b) and 3(b), the cathode 41, the first transport layer 42, the active layer 43, the second transport layer 44 and the anode 45 are sequentially arranged along the direction facing away from the base substrate 10.

For example, by taking a case that the cathode 41, the first transport layer 42, the active layer 43, the second transport layer 44 and the anode 45 are sequentially arranged along the direction facing away from the base substrate 10 as an example, the sunlight passes through the anode 45 and the second transport layer 44 to irradiate the active layer 43, the active layer 43 converts light energy into electric energy and then the electric energy is output through the anode 45 and the cathode 41 so as to supply power to the OLED array substrate. The first transport layer 42 and the second transport layer 44 take effects of optimizing an energy level structure and improving energy conversion efficiency.

Those skilled in the art should know that for different types of solar cells 40, materials of the first transport layers 42, the active layers 43 and the second transport layers 44 are different.

In the embodiments of the present disclosure, the solar cell 40 includes the cathode 41, the first transport layer 42, the active layer 43, the second transport layer 44 and the anode 45 which are sequentially arranged for supplying power to the OLED array substrate.

For example, the solar cell 40 is a perovskite solar cell (PSC) or an organic solar cell (OSC) (which is also called as organic photovoltaics (OPV). For example, the solar cell 40 includes the plurality of sub solar cells connected with each other in series, and the plurality of sub solar cells connected with each other in series supply power to the OLED array substrate.

For example, a voltage output by one sub PSC or a voltage output by one sub OSC approximates to 1V, but a voltage for the OLED array substrate to enable each OLED display element to emit light is greater than 1V; and thus, according to the embodiments of the present disclosure, the PSC or the OSC is formed by the plurality of sub solar cells connected with each other in series so as to supply power to the OLED array substrate.

For example, in the case that the solar cell 40 is the PSC, the material of the active layer 43 is perovskite which for example is formed by a complex of $PbCl_2$ and $CH_3NH_3I$, the first transport layer 42 is also called as an electron transport layer (ETL), the material of the first transport layer 42 for example is [6,6]-phenyl-C61-butyric acid methyl ester (PCBM), the second transport layer 44 is also called as a hole transport layer (HTL), and the material of the second transport layer 44 for example is $MoO_x$.

For example, $PbCl_2$ is formed by adopting an evaporation (EV) process, and $CH_3NH_3I$ only needs to be heated; PCBM is formed by adopting the EV process; and $MoO_x$ is formed by adopting a sputtering process.

For example, in the case that the solar cell 40 is the organic solar cell, the material of the active layer 43 is poly [[2,6'-4,8-di(5-ethylhexylthienyl)benzo[1,2-b;3,3-b]dithiophene] [3-fluoro-2-[(2-ethylhexyl)carbonyl]thieno[3,4-b]thiophenediyl]]:[6,6]-phenyl C71butyric acid methyl ester (PTB7-TH:PC71BM), the first transport layer 42 is also called as a cathode interface modification layer, the material of the first transport layer 42 is poly [(9,9-bis(3'-(N,N-d methylamino)propyl)-2,7-fluorene)-alt-2,7-(9,9-dioctylfluorene)] (PFN), the second transport layer 44 is also called as the HTL, and the material of the second transport layer 44 is $MoO_x$.

For example, both PTB7-TH:PC71BM and PFN are formed by adopting an inkjet process.

Figure 4:
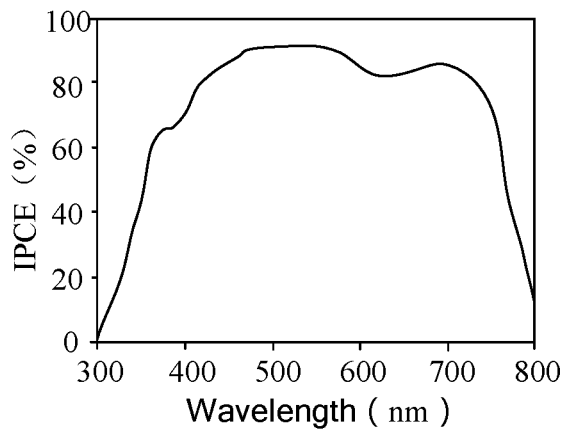
FIG. 4 is a graph of photoelectric conversion curve of a perovskite solar cell provided by the embodiments of the present disclosure.
Figure 5:
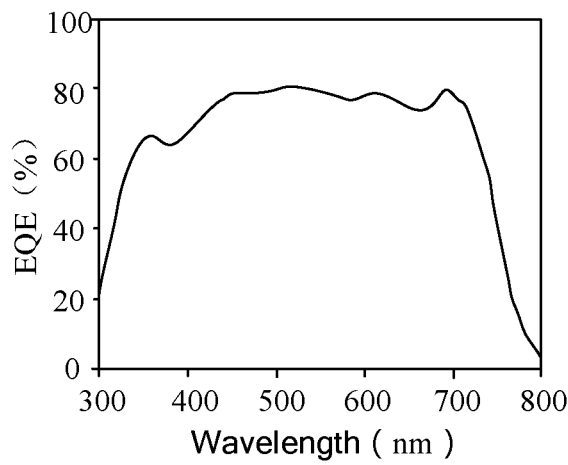
FIG. 5 is a graph of photoelectric conversion curve of an organic solar cell provided by the embodiments of the present disclosure.

For example, in the case that the material of the cathode 41 is Al and the material of the anode 44 is ITO, as shown in FIG. 4, it can be seen that in a visible light range, monochromatic incident photon-to-electron conversion efficiency (IPCE) of the PSC prepared by adopting the above materials reaches about 80%; and as shown in FIG. 5, it can be seen that in the visible light range, external quantum efficiency (EQE) of the OSC prepared by adopting the above materials reaches about 80%. It also means that the perovskite cell and the OSC have good light absorption capacity, and about 80% of sunlight are absorbed and utilized so as to show excellent absorption capacity.

The EQE means: a ratio of the number of charge carriers generated in the solar cell 40 to the number of photons with a certain energy, which are incident to the surface of the solar cell from the outside.

In the embodiments of the present disclosure, compared with other types of solar cells 40, the PSC or the OSC is adopted on the OLED array substrate so that, in the case that the OLED array substrate is applied to the OLED display apparatus, heat generation of the OLED display apparatus is reduced, and user's experience is improved.

For example, as shown in FIG. 1, the OLED display element layer 50 includes a plurality of OLED display elements, and each OLED display element includes an anode 51, a light-emitting functional layer 52 and a cathode 53 which are sequentially arranged along a direction facing away from the base substrate 10.

For example, the light-emitting functional layer 52 at least includes a hole transport layer (HTL) arranged close to the anode 51, an electron transport layer (ETL) arranged close to the cathode 53, and an light emitting layer (EL) arranged between the HTL and the ETL.

In the embodiments of the present disclosure, a material of the anode 51, e.g., ITO, needs to have a high work function; in the case that a pattern of the anode 51 is formed by using ITO, the sputtering process is generally adopted and the sputtering process has adverse effects on the organic material; a material of the cathode 53, e.g., metals of Ag, Al, Ca, In, Li, Mg and the like, needs to have a low work function, the evaporation process is generally adopted and the evaporation process has no adverse effects on the organic material; the light-emitting functional layer 52 includes the organic material, and thus, by arranging the anode 51, the light-emitting functional layer 52 and the cathode 53 along the direction facing away from the base substrate 10, the adverse effects on the light-emitting functional layer 52 due to formation of the anode 51 is avoided.

Figure 6:
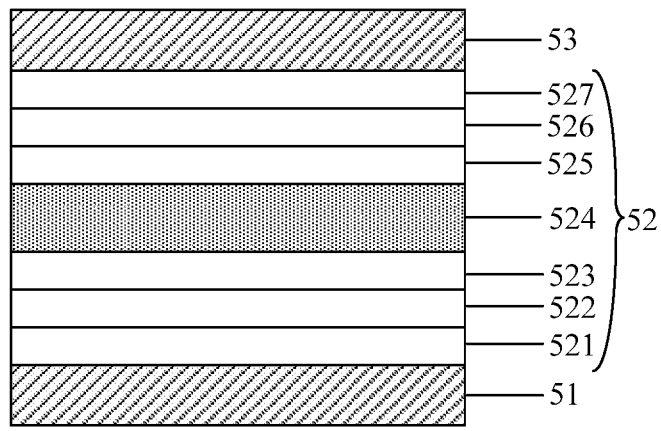
FIG. 6 is a sectional schematic diagram I of an OLED display element provided by the embodiments of the present disclosure.

For example, as shown in FIG. 6, the light-emitting functional layer 52 includes: a hole injection Layer (HIL) 521, the HTL 522, an electron barrier layer (EBL) 523, the light emitting layer (EML) 524, a hole barrier layer (HBL) 525, the ETL 526 and an electron injection layer (EIL) 527 which are sequentially arranged along a direction facing away from the anode 51.

In the embodiments of the present disclosure, the HIL 521, the HBL 523, the HBL 525 and the EIL 527 optimize the energy level structure and improve luminous efficiency.

For example, the OLED display element is of the top light-emitting element; and both the cathode 53 and the anode of the OLED display element include a metal.

For example, in the case that the OLED display element of the top light-emitting element is applied to the OLED display apparatus, the OLED display apparatus further includes the polarizer 120 arranged on the side of the package layer 110 (for example, the package cover plate) as shown in FIG. 8, which faces away from the OLED array substrate.

Figure 7A:
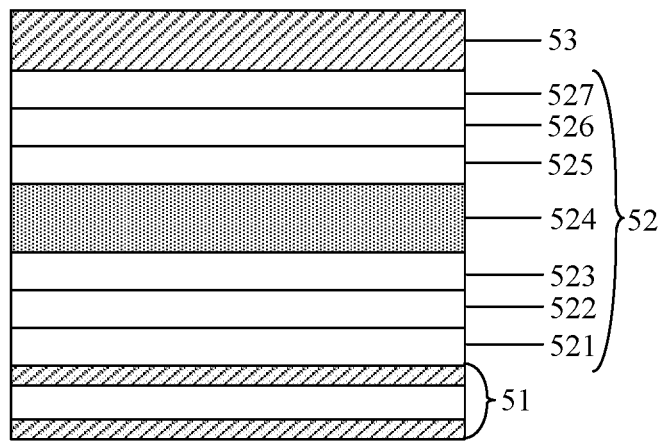
FIG. 7(a) is a sectional schematic diagram II of the OLED display element provided by the embodiments of the present disclosure.
Figure 7B:
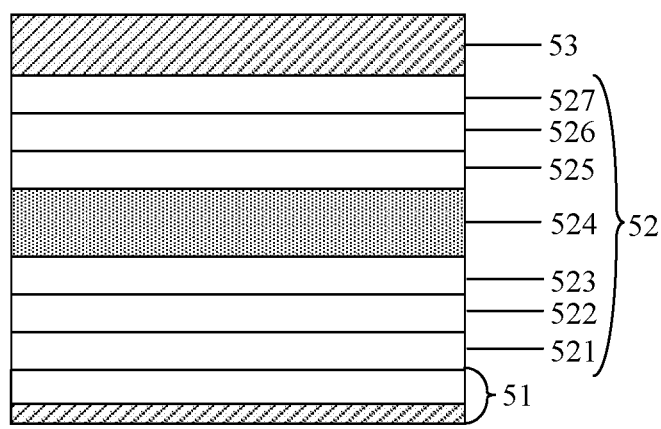
FIG. 7(b) is a sectional schematic diagram III of the OLED display element provided by the embodiments of the present disclosure.

For example, as shown in FIG. 7(*a*), in consideration that the metal is easy to oxidize upon in contact with moisture, the anode 51 is of a three-layer structure and includes two transparent conductive layers and a metal layer arranged between the two transparent conductive layers, the transparent conductive layer on the side close to the base substrate 10 takes an effect of preventing the metal layer from being oxidized due to direct contact with moisture. Exemplarily, a material of two transparent conductive layer is ITO, and a material of the metal layer is Ag.

For example, as shown in FIG. 7(*b*), the anode 51 is of a two-layer structure and includes a metal layer and a transparent conductive layer arranged on a side of the metal layer close to the base substrate 10. Exemplarily, a material of the transparent conductive layer is ITO, and a material of the metal layer includes Ag or Al.

It should be noted that although the cathode 53 includes the metal, in a case of not influencing normal working of the cathode 53, a thickness of the cathode 53 needs to be as small as possible so as to enable light to transmit.

Those skilled in the art should know that in the case that both the cathode 53 and the anode 51 include the metal, part of light emitted by the light-emitting region is reflected to and from between the cathode 53 and the anode 51 so as to form a microcavity structure between the cathode 53 and the anode 51, and meanwhile, light with a specific wavelength is strengthened and emerges with a specific angle by regulating a thickness between the cathode 53 and the anode 51. For example, the light emerges with a direction perpendicular to the base substrate 10 by regulating the thickness between the cathode 53 and the anode 51, and thus, luminous efficiency of the light emerging along the direction perpendicular to the base substrate 10 is improved, which is consistent with the user's habit of viewing the display vertically, and meanwhile, chroma of single-color light is also improved.

For example, in FIG. 1(*a*), the solar cell 40 is arranged between the OLED display element layer 50 and the pixel driving circuit 20; the cathode 41 of the solar cell 40 generally adopts a metal material, and in this case, even though the thickness of the cathode 41 of the solar cell 40 is set as small as possible so as to enable light to transmit, transmittance of the cathode 41 of the solar cell 40 is still relatively low. Thus, according to the embodiments of the present disclosure, by adopting the OLED display element of the top light-emitting element, light for display is prevented from passing through the solar cell 40 to reduce light transmittance.

By taking the OLED display element of the top light-emitting element as an example, compensation efficiency of the PSC and compensation efficiency of the OSC are respectively estimated below.

In a first step, if transmittance of the polarizer 120 is 45% and transmittance of the package layer 110 is 90.84%, total transmittance of the polarizer 120 and the package layer 110 is 45%×90.84%≈40.88%; and if the maximum displayable brightness of the OLED display apparatus is 350 nit, brightness without coverage of the polarizer 120 and the package layer 110 is 350÷40.88%≈856.2 nit, wherein 1 nit=1 cd/m² (candela per square meter).

In a second step, if a user adopts half of the maximum displayable brightness of the OLED display apparatus to view, luminous brightness without coverage of the polarizer 120 and the package layer 110 is 856.2÷2=428.1 nit, and according to color coordinates of R (0.663, 0.336), G (0.244, 0.704), B (0.141, 0.052) and W (0.299, 0.316), brightness decomposition is carried out to obtain single-color brightness, i.e., R is 110.7 nit, G is 285.1 nit and B is 32.3 nit, wherein R represents red light, G represents green light, B represents blue light, and W represents white light.

In a third step, if brightness of single-color light and luminous efficiency of the single-color light are known, a current density of the single-color light is obtained according to a formula that $$\frac{brightness}{luminous\ efficiency} = current\ density;$$

if luminous efficiency of the red light is 50 cd/A (candela per ampere), luminous efficiency of the green light is 120 cd/A and luminous efficiency of the blue light is 6.5 cd/A, the current density of the red light is $$\frac{110.7}{50} \approx 2.21\ A/m^2$$

(ampere per square meter), and similarly, the current density of the green light approximately is 2.38 A/m², and the current density of the blue light approximately is 4.96 A/m²; on this basis, if an area of a display region of the OLED display apparatus is known, a current required by the single-color light is obtained according to a formula that current density×area=current, if a 5.7 inch (71×125 mm) OLED display apparatus is adopted, the current required by the red light is 2.21×0.008875≈0.02 A (ampere), and similarly, a current required by the green light approximately is 0.021 A, and the current required by the blue light approximately is 0.044 A; and if it is known that a voltage is 7.6V (volt), according to a formula that voltage×total current=total power consumption, total power consumption total power consumption=7.6×(0.02+0.021+0.044)=0.64 W(watt) of the OLED display apparatus is obtained, i.e., if the user adopts half of the maximum displayable brightness of the OLED display apparatus to view, the power consumption is 0.64 W.

In a fourth step, if an area ratio of the light-emitting region in the OLED display element layer 50 is 19%, an area ratio of the transparent non-light-emitting region is 81%, and the sunlight needs to pass through the package layer 110 and the polarizer 120 to irradiate the solar cell 40, and thus, a utilization rate of the sunlight is 81%×4.088%≈33.1%.

In a fifth step, if the PSC is adopted and it is known that the IPCE of the PSC is 15% and sunlight power in unit area is 100 mW/cm² under the condition of AM1.5 (i.e., the sunlight when a zenith angle is 48 degrees), power consumption which is compensated to the OLED display apparatus by the PSC is 100 mW/cm²×33.1%×15%×0.008875 m²≈0.44 W, so that it is calculated that the compensation efficiency of the PSC is 0.44÷0.64=68.75%; and if the OSC is adopted and it is known that the IPCE of the OSC is 10% and sunlight power in unit area is 100 mW/cm² under the condition of AM1.5, power consumption which is compensated to the OLED display apparatus by the OSC is 100 mW/cm²×33.1%×10%×0.008875 m²≈0.29 W, so that it is calculated that the compensation efficiency of the PSC is 0.29÷0.64≈45.31%.

For example, both the anode 51 and the cathode 53 of the OLED display element enable light to transmit. For the structure shown in FIG. 1(*a*), the solar cell 40 is further arranged between the portion of the OLED display element layer 50 in the light-emitting region and the pixel driving circuit 20, and a portion of the solar cell 40 between the portion of the OLED display element layer 50 in the light-emitting region and the pixel driving circuit 20 is electrically connected with a portion of the solar cell 40 between the portion of the OLED display element layer 50 in the non-light-emitting region and the pixel driving circuit 20.

For example, the material of the anode 51 is a transparent conductive material such as ITO and the like, and the material of the cathode 53 includes a metal.

It should be noted that although the cathode 53 includes the metal, in the case of not influencing normal working of the cathode 53, the thickness of the cathode 53 needs to be as small as possible so as to enable light to transmit.

In the embodiments of the present disclosure, by adopting the OLED display element of which both the anode 51 and the cathode 53 enable light to transmit, compared to the OLED display element with the top light-emitting structure and the OLED display element with the bottom light-emitting structure, the light energy of the sunlight which irradiates the solar cell 40 is the maximum, so that the electric energy obtained by the solar cell 40 converting the light energy is the maximum.

Herein, by taking the OLED display element of which both the anode 51 and the cathode 53 enable light to transmit as an example, the compensation efficiency of the PSC and the compensation efficiency of the OSC are respectively estimated.

In a first step, if transmittance of the package layer 110 is 90.84% and the maximum displayable brightness of the OLED display apparatus is 350 nit, the brightness without coverage of the package layer 110 is 350÷90.84%≈385.3 nit.

In a second step, if the user adopts half of the maximum displayable brightness of the OLED display apparatus to view, luminous brightness without coverage of the package layer 110 is 385.3÷2=192.65 nit, and according to color coordinates of R (0.663, 0.336), G (0.244, 0.704), B (0.141, 0.052) and W (0.299, 0.316), brightness decomposition is carried out to obtain single-color brightness, i.e., R is 49.8 nit, G is 128.3 nit and B is 14.5 nit.

In a third step, when brightness of single-color light and luminous efficiency of the single-color light are known, a current density of the single-color light is obtained according to a formula that $$\frac{\text{brightness}}{\text{luminous efficiency}} = \text{current density},$$

if luminous efficiency of the red light is 50 cd/A (candela per ampere), luminous efficiency of the green light is 120 cd/A and luminous efficiency of the blue light is 6.5 cd/A, the current density of the red light is $$\frac{49.8}{50} \approx 0.996/m^2,$$

and similarly, the current density of the green light approximately is 1.07 A/m², and the current density of the blue light approximately is 2.236 A/m²; on this basis, if an area of a display region of the OLED display apparatus is known, a current required by the single-color light is obtained according to a formula that current density×area=current, if a 5.7 inch (71×125 mm) OLED display apparatus is adopted, the current required by the red light is 0.996×0.008875=≈0.009 A, and similarly, the current required by the green light approximately is 0.009 A, and the current required by the blue light approximately is 0.02 A; and if it is known that a voltage is 7.6V, according to a formula that voltage×total current=total power consumption, total power consumption total power consumption=7.6×(0.009+0.009+0.02)=0.29 W of the OLED display apparatus is obtained, i.e., if the user adopts half of the maximum displayable brightness of the OLED display apparatus to view, the power consumption is 0.29 W.

In a fourth step, if an area ratio of the light-emitting region in the OLED display element layer 50 is 19%, an area ratio of the transparent non-light-emitting region is 81%, the transmittance of the light-emitting region is 80%, and the sunlight needs to pass through the package layer 110 to irradiate the solar cell 40, and thus, a utilization rate of the sunlight is 81%×90.84%+19%×90.84%×80%≈87.39%.

In a fifth step, if the PSC is adopted and it is known that the IPCE of the PSC is 15% and sunlight power in unit area is 100 mW/cm² under the condition of AM1.5, power consumption which is compensated to the OLED display apparatus by the PSC is 100 mW/cm²×87.39%×15%× 0.008875 m²≈1.16 W, so that it is calculated that the compensation efficiency of the PSC is 1.16÷0.29=400%; and if the OSC is adopted and it is known that the IPCE of the OSC is 10% and sunlight power in unit area is 100 mW/cm² under the condition of AM1.5, power consumption which is compensated to the OLED display apparatus by the OSC is 100 mW/cm²×87.39%×10%×0.008875 m²≈0.78 W, so that it is calculated that the compensation efficiency of the PSC is 0.78÷0.29≈268.97%.

On this basis, in the case that the OLED display apparatus emits light, the light emitted by the light-emitting region also irradiates the solar cell 40, and similarly, the solar cell 40 converts such part of light energy into electric energy for compensating power consumption.

From the above, for collocation of the PSC and the OLED display element with the top light-emitting type, collocation of the OSC and the OLED display element with the top light-emitting type, collocation of the PSC and the OLED display element of which both the anode 51 and the cathode 53 enable light to transmit and collocation of the OSC and the OLED display element of which both the anode 51 and the cathode 53 enable light to transmit, by comparing the compensation efficiency of the above different collocations, it can be seen that the compensation efficiency of the collocation of the PSC and the OLED display element of which both the anode 51 and the cathode 53 enable light to transmit is the highest.

For example, two cell pins 101 are arranged in a bonding region of the OLED array substrate, and the two cell pins 101 are respectively connected with the cathode 41 and the anode 45 of the solar cell 40.

FIG. 1(c) is a planar schematic diagram of the OLED array substrate provided by the embodiments of the present disclosure. As shown in FIG. 1(c), the OLED array substrate according to the embodiments of the disclosure comprises an active region AA and a peripheral region PA surrounding the active region AA, the bonding region is provided in the peripheral region PA, and the two cell pins 101 are arranged in the bonding region. For example, the components such as the pixel driving circuit 20, the OLED display element layer 50 and the solar cell 40 are provided in the active region AA.

In the embodiments of the present disclosure, the two cell pins 101 are arranged in the bonding region of the OLED array substrate and are respectively connected with the cathode 41 and the anode 45 of the solar cell 40, so that a lead for connecting the solar cell 40 with a power supply circuit in the OLED display apparatus become more firm.

The embodiments of the present disclosure further provide a display apparatus. As shown in FIG. 8, the display apparatus comprises an OLED array substrate 100, which is the OLED array substrate according to any one of the above-mentioned embodiments. The display apparatus for example further comprises a package layer 110 (such as a package cover plate) covering the OLED array substrate 100 to protect the OLED array substrate 100. For example, the display apparatus further comprises a polarizer 120 provided on a side of the package layer 110 facing away from the OLED array substrate 100. For example, the display apparatus according to the embodiments of the present disclosure further includes a power supply circuit, the power supply circuit includes a direct current (DC) converter, and the solar cell is electrically connected with an input end of the DC converter. For example, the cathode 41 and the anode 45 of the solar cell 40 are electrically connected with the input end of the DC converter.

For example, the OLED display element and the pixel driving circuit are electrically connected with an output end of the DC converter. For example, the cathode 53 of the OLED display element and the pixel driving circuit 20 connected with the anode 51 of the OLED display element are electrically connected with the output end of the DC converter. The OLED display apparatus further includes other power supply devices, e.g., a lithium battery, which are electrically connected with the input end of the DC converter.

For example, the cathode 41 and the anode 45 of the solar cell 40 are electrically connected with the two cell pins 101 in the bonding region on the OLED array substrate, and then the two cell pills 101 are electrically connected with the input end of the DC converter.

For example, the DC converter is a DC/DC (DC converter, or DC transformer) for converting a fixed DC voltage into a variable DC voltage, and moreover, the DC/DC, according to the compensation efficiency of the solar cell 40, selects to only utilize the solar cell 40 to supply power, or only utilize other power supply devices in the OLED display apparatus to supply power, or simultaneously utilize the solar cell 40 and other power supply devices in the OLED display apparatus to supply power.

According to embodiments of the present disclosure, the display apparatus which includes the OLED array substrate is provided. The OLED array substrate includes the pixel driving circuit and the OLED display element layer. The OLED array substrate further includes the solar cell, the solar cell is arranged on the side of the pixel driving circuit which faces the incident ambient light. The incident ambient light irradiates the solar cell, and then the solar cell converts light energy into electric energy and supplies the electric energy to the OLED array substrate for compensating electric energy required by the OLED display element for emitting light, so as to benefit energy saving and implement green and environmental protection. The market is enriched and more choices are provided for users.

For example, the region in the pixel driving circuit, where structures such as the thin film transistor and the like are arranged, is not transparent, and thus, by arranging the solar cell on the side of the pixel driving circuit which faces the incident ambient light, it can avoid reduction of the sunlight irradiating the solar cell due to shielding of the structures such as the thin film transistor and the like, or it can avoid arrangement of other light guide structures in the OLED array substrate in order to enable the sunlight originally irradiating the structures such as the thin film transistor and the like to irradiate the solar cell. Therefore, in the embodiments of the present disclosure, by arranging the solar cell on the side of the pixel driving circuit which faces to the incident ambient light, the OLED array substrate has the advantages of high sunlight utilization rate and simple structure.

The foregoing embodiments merely are exemplary embodiments of the disclosure, and not intended to define the scope of the disclosure, and the scope of the disclosure is determined by the appended claims.

The invention claimed is:

1. An Organic Light-Emitting Diode (OLED) array substrate, comprising a base substrate, a pixel driving circuit and an OLED display element layer which are arranged on the base substrate, wherein
    the OLED array substrate further comprises a solar cell, the solar cell is arranged on a side of the pixel driving circuit which faces an incident ambient light, the solar cell and the pixel driving circuit are insulated from each other, and the solar cell and the OLED display element layer are insulated from each other;
    the OLED display element layer is arranged on a side of the pixel driving circuit which faces away from the base substrate;
    the OLED display element layer is divided into a light-emitting region and a non-light-emitting region, the non-light-emitting region is light transmissive, and the solar cell is at least arranged between a portion of the OLED display element layer in the non-light-emitting region and the pixel driving circuit;
    the OLED display element layer comprises a plurality of OLED display elements, and each of the plurality of OLED display elements comprises an anode, a light-emitting functional layer and a cathode which are sequentially arranged along a direction facing away from the base substrate;
    the pixel driving circuit comprises a driving transistor and a storage capacitor which is connected with the driving transistor;
    both the anode and the cathode of the OLED display element are light transmissive;
    the solar cell is further arranged between a portion of the OLED display element layer in the light-emitting region and the pixel driving circuit;
    a portion of the solar cell between the portion of the OLED display element layer in the light-emitting region and the pixel driving circuit is electrically connected with a portion of the solar cell between the portion of the OLED display element layer in the non-light-emitting region and the pixel driving circuit.

2. The OLED array substrate according to claim 1, wherein an insulation layer is arranged between the solar cell and the pixel driving circuit and another insulation layer is arranged between the solar cell and the OLED display element layer.

3. The OLED array substrate according to claim 1, wherein
    the OLED display element layer is arranged on a side of the pixel driving circuit which faces away from the base substrate; and
    the OLED display element layer is divided into a light-emitting region and a non-light-emitting region, and the solar cell is at least arranged on a side of a portion of the OLED display element layer in the non-light-emitting region which faces the incident ambient light.

4. The OLED array substrate according to claim 3, wherein an insulation layer is arranged between the solar cell and the OLED display element layer.

5. The OLED array substrate according to claim 1, wherein
    the solar cell includes a cathode, a first transport layer, an active layer, a second transport layer and an anode which are sequentially arranged; and
    in the solar cell, a portion arranged on a side of the active layer which faces away from the base substrate is light transmissive.

6. The OLED array substrate according to claim 1, wherein the solar cell is a perovskite solar cell or an organic solar cell.

7. The OLED array substrate according to claim 1, wherein the solar cell includes a plurality of sub solar cells connected with each other in series, and the plurality of sub solar cells connected with each other in series supply power to the OLED array substrate.

8. The OLED array substrate according to claim 1, wherein the light-emitting functional layer includes: a hole injection layer, a hole transport layer, an electron barrier layer, a light-emitting layer, a hole barrier layer, an electron transport layer and an electron injection layer which are sequentially arranged along a direction facing away from the anode.

9. The OLED array substrate according to claim 1, wherein each of the plurality of OLED display elements is of a top light-emitting type, and both the cathode and the anode of each of the plurality of OLED display elements include a metal.

10. The OLED array substrate according to claim 5, wherein two cell pins are provided in a bonding region of the OLED array substrate, and the two cell pins are respectively connected with the cathode and the anode of the solar cell.

11. A display apparatus, comprising the OLED array substrate according to claim 1.

12. The display apparatus according to claim 11, further comprising a power supply circuit, wherein the power supply circuit includes a direct current (DC) converter, and the solar cell is electrically connected with an input end of the DC converter.

13. The display apparatus according to claim 12, wherein
the OLED display element layer includes a plurality of OLED display elements; and
the plurality of OLED display elements and the pixel driving circuit are electrically connected with an output end of the DC converter.

14. The display apparatus according to claim 12, further comprising a package layer arranged oppositely to the OLED array substrate, wherein
the OLED display element layer includes a plurality of OLED display elements, each of the plurality of OLED display elements is a top light-emitting device, and the OLED display apparatus further comprises a polarizer arranged on a side of the package layer which faces away from the OLED array substrate.

* * * * *